(12) United States Patent
Kawashima

(10) Patent No.: US 10,848,146 B2
(45) Date of Patent: Nov. 24, 2020

(54) RESET CIRCUIT

(71) Applicant: FUJI ELECTRIC CO., LTD., Kawasaki (JP)

(72) Inventor: Tetsuya Kawashima, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/696,636

(22) Filed: Nov. 26, 2019

(65) Prior Publication Data

US 2020/0220535 A1 Jul. 9, 2020

(30) Foreign Application Priority Data

Jan. 8, 2019 (JP) .................................. 2019-001051

(51) Int. Cl.
*H03K 17/22* (2006.01)

(52) U.S. Cl.
CPC .................................. *H03K 17/223* (2013.01)

(58) Field of Classification Search
None
See application file for complete search history.

(56) References Cited

U.S. PATENT DOCUMENTS

| 6,847,240 | B1* | 1/2005 | Zhou | H03K 17/223 327/143 |
| 2011/0062996 | A1* | 3/2011 | Chang | G01R 17/02 327/77 |
| 2015/0042386 | A1* | 2/2015 | Bhowmik | H03K 17/223 327/143 |

FOREIGN PATENT DOCUMENTS

| JP | H08-84058 A | 3/1996 |
| JP | H10-65505 A | 3/1998 |
| JP | 2001-285046 A | 10/2001 |
| JP | 2013-038464 A | 2/2013 |

* cited by examiner

*Primary Examiner* — Lincoln D Donovan
*Assistant Examiner* — Khareem E Almo
(74) *Attorney, Agent, or Firm* — Rabin & Berdo, P.C.

(57) ABSTRACT

A reset circuit includes: an output circuit that outputs a reset release signal for releasing reset of a reset target circuit that is to be applied with a power supply voltage, when a first voltage that rises with a rise in the power supply voltage reaches a first reference voltage that rises with a rise in the power supply voltage until the first reference voltage reaches a target level; and an inhibit circuit that inhibits the reset release signal from being output to the reset target circuit until the power supply voltage reaches a third level, the third level being higher than a first level at a time when the first reference voltage exceeds the first voltage, the third level being lower than a second level at a time when the first voltage reaches the target level.

15 Claims, 8 Drawing Sheets

RESET CIRCUIT

CROSS-REFERENCE TO RELATED APPLICATION

The present application claims priority pursuant to 35 U.S.C. § 119 from Japanese Patent Application No. 2019-001051, filed on Jan. 8, 2019, the entire disclosure of which is hereby incorporated by reference herein.

BACKGROUND ART

Technical Field

The present disclosure relates to a reset circuit.

Related Art

In activating an integrated circuit including a digital circuit and/or a control circuit, known is a reset circuit that monitors a rise in a power supply voltage of the integrated circuit to prevent an unstable initial operation of the integrated circuit, and releases reset of the integrated circuit when the power supply voltage has risen to a stable voltage. For example, a reset circuit compares a divided voltage obtained by dividing a power supply voltage with a reference voltage and, when the divided voltage reaches the reference voltage, determines that the power supply voltage has stabilized and release the reset of an integrated circuit (for example, Japanese Patent Application Publication No. H8-84058).

However, in some configurations of a reference voltage generation circuit that generates the reference voltage, the divided voltage may exceed the reference voltage even before the power supply voltage reach a stable voltage, due to a difference in slope of rise between the divided voltage and the reference voltage. This may release the reset of the integrated circuit and cause a malfunction.

Thus, an object of the present disclosure is to provide a reset circuit that reliably inhibits a reset release signal from being output until a power supply voltage reaches a stable voltage.

SUMMARY

A main aspect of the present disclosure for solving an issue described above is a reset circuit comprising: an output circuit that outputs a reset release signal for releasing reset of a reset target circuit that is to be applied with a power supply voltage, when a first voltage that rises with a rise in the power supply voltage reaches a first reference voltage that rises with a rise in the power supply voltage until the first reference voltage reaches a target level; and an inhibit circuit that inhibits the reset release signal from being output to the reset target circuit until the power supply voltage reaches a third level, the third level being higher than a first level at a time when the first reference voltage exceeds the first voltage, the third level being lower than a second level at a time when the first voltage reaches the target level.

Other features of the present disclosure will become apparent from descriptions of the present specification and of the accompanying drawings.

With the present disclosure, it is possible to provide a reset circuit that reliably inhibits a reset release signal from being output until a power supply voltage reaches a stable voltage.

DETAILED DESCRIPTION

At least the following details will become apparent from descriptions of the present specification and of the accompanying drawings.

One Configuration Example of Integrated Circuit

Figure 1:
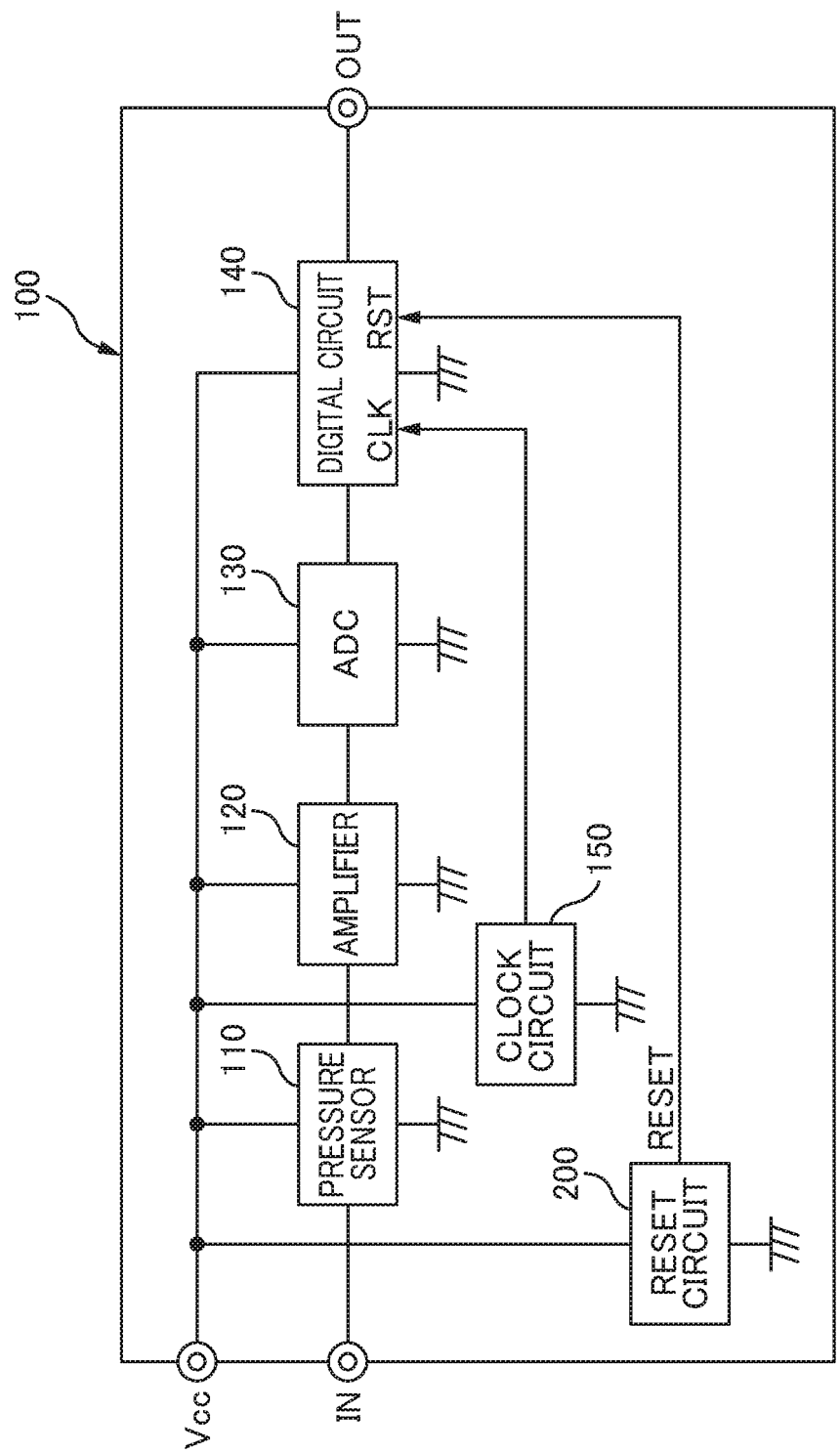
FIG. 1 is a block diagram illustrating one configuration example of an integrated circuit in which a reset circuit according to the embodiments is used.

FIG. 1 is a block diagram illustrating one configuration example of an integrated circuit that employs a reset circuit according to an embodiment of the present disclosure.

An integrated circuit 100 detects a predetermined pressure generated in a pressure measurement target device (a vehicle-mounted electronic device, a home appliance, etc.), and digitally processes a detection result of the pressure, for example. The integrated circuit 100 includes a pressure sensor 110, an amplifier 120, an AD converter (ADC) 130, a digital circuit 140, a clock circuit 150, and a reset circuit 200.

The pressure sensor 110 detects a predetermined pressure IN generated in a pressure measurement target device, and is configured with, for example, a resistance bridge-type sensor that uses a semiconductor piezoelectric element. The semiconductor piezoelectric element has a structure in which a piezoresistor is formed, by a semiconductor processing technique, on a diaphragm that is obtained by partially processing a silicon substrate so as to be thin by etching or the like. When a pressure is applied to the semiconductor piezoelectric element from the outside, the piezoresistor receives stress caused by bending the diaphragm, thereby changing a resistance value. The pressure sensor 110 results in detecting a change in resistance value of the piezoresistor as a change in pressure.

The amplifier 120 amplifies a pressure detection value (analog value) output from the pressure sensor 110 by an amplification factor such that the ADC 130 on a subsequent stage can convert the pressure detection value into a digital value.

The ADC 130 converts the amplified pressure detection value output from the amplifier 120 into a digital value. The ADC 130 is configured with, for example, a ΔΣ AD converter.

The digital circuit 140 adjusts the digital value indicative of the pressure detection value output from the ADC 130 such that varied output characteristics of the pressure sensor 110 caused by variation at a manufacturing stage and the like will be desired output characteristics, and then converts a signal format into a signal format needed for a circuit (not illustrated) on a subsequent stage that is connected to the integrated circuit 100, and outputs a digital signal OUT thereto.

The clock circuit 150 generates a clock signal used as a reference when the digital circuit 140 operates. The clock circuit 150 includes, for example, a free-running oscillator including a crystal resonator, and a frequency divider that performs frequency division until an oscillation signal output from the free-running oscillator achieves a clock signal at a frequency needed for digital processing in the digital circuit 140.

A power supply voltage Vcc is applied to the pressure sensor 110, the amplifier 120, the ADC 130, the digital circuit 140, and the clock circuit 150. In order to allow the digital circuit 140 to correctly perform digital processing, the reset circuit 200 resets the digital circuit 140 until the power supply voltage Vcc rises to a voltage at which the digital circuit 140 can normally operate, and releases the reset of the digital circuit 140 when the power supply voltage Vcc has risen to the voltage at which the digital circuit 140 can normally operate. The integrated circuit 100 may further include an output unit that outputs a signal indicative of a reset operation performed by the reset circuit 200 to the outside. A configuration example of the reset circuit 200 will be described below as first to sixth embodiments (reset circuits 200A to 200F).

First Embodiment

Figure 2:
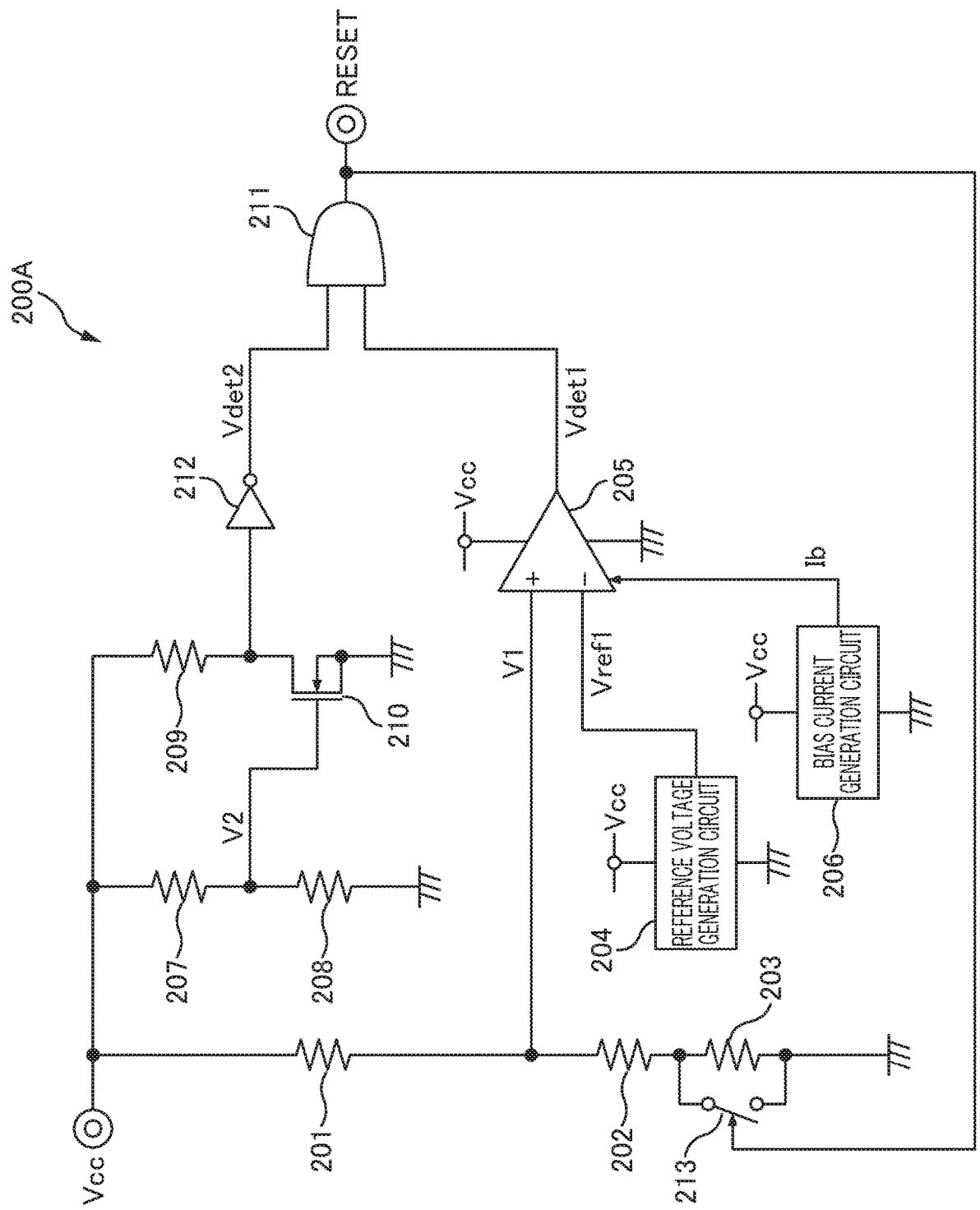
FIG. 2 is a circuit block diagram illustrating a reset circuit according to a first embodiment.
Figure 3:
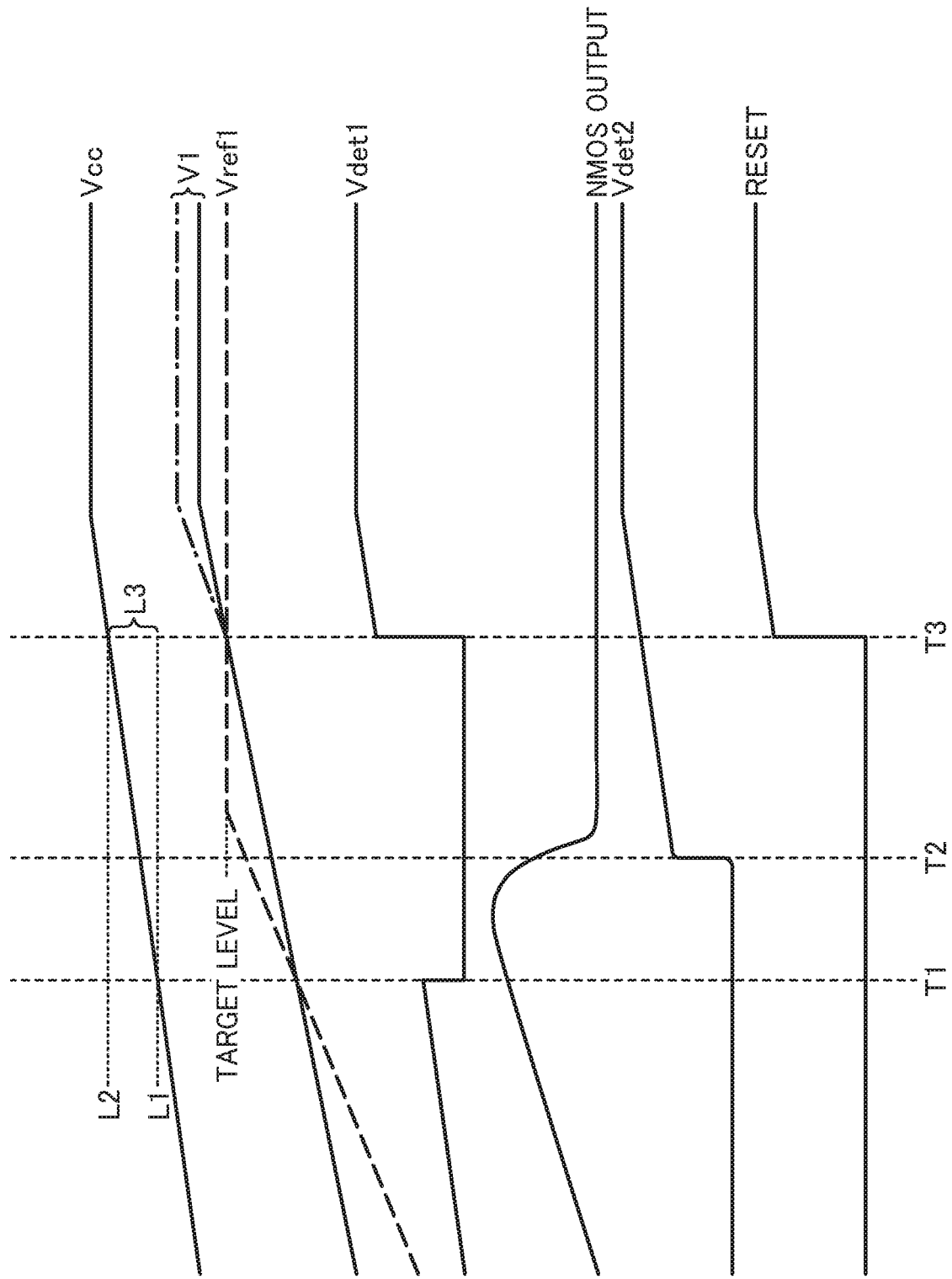
FIG. 3 is a timing chart illustrating an operation of the reset circuit according to the first embodiment.

FIG. 2 is a circuit block diagram illustrating a reset circuit according to the first embodiment. FIG. 3 is a timing chart illustrating an operation of the reset circuit according to the first embodiment.

First, a configuration of the reset circuit 200A will be described.

The reset circuit 200A includes first voltage divider resistors 201 to 203, a reference voltage generation circuit 204, a first comparator 205, a bias current generation circuit 206, second voltage divider resistors 207 and 208, a pull-up resistor 209, an NMOS transistor 210, an AND gate 211, an inverter 212, and a switch circuit 213.

The first voltage divider resistors 201 to 203 are connected in series between the power supply voltage Vcc and the ground. The reference voltage generation circuit 204 is applied with the power supply voltage Vcc and generates a first reference voltage Vref1 serving as a target level, and is configured with, for example, a bandgap reference voltage generation circuit. When the power supply voltage Vcc is applied, a first voltage V1 that appears at a connection point of the first voltage divider resistors 201 and 202 rises with a rise in the power supply voltage Vcc, and the first reference voltage Vref1 rises with the rise in the power supply voltage Vcc until the first reference voltage Vref1 reaches the target level. Herein, resistance values of the first voltage divider resistors 201 to 203 and a value of the first reference voltage Vref1 are previously set such that the first voltage V1 is higher than the target level of the first reference voltage Vref1 when the power supply voltage Vcc has risen to a stable voltage.

The first voltage V1 is applied to a non-inverting input terminal (+) of the first comparator 205. The first reference voltage Vref1 is applied to an inverting input terminal (−) of the first comparator 205. Then, the first comparator 205 outputs a detection signal Vdet1 at a logic level "L" when the first voltage V1 is lower than the first reference voltage Vref1, and outputs a detection signal Vdet1 at a logic level "H" when the first voltage V1 is higher than the first reference voltage Vref1. Note that the detection signal Vdet1 at the logic level "H" is a reset release signal for releasing reset of the digital circuit 140.

The bias current generation circuit 206 is applied with the power supply voltage Vcc and generates a bias current Ib for operating the first comparator 205.

The second voltage divider resistors 207 and 208 are connected in series between the power supply voltage Vcc and the ground. The pull-up resistor 209 and the NMOS transistor 210 are connected in series between the power supply voltage Vcc and the ground. Then, a second voltage V2 that appears at a connection point of the second voltage divider resistors 207 and 208 is applied to a gate of the NMOS transistor 210.

The first reference voltage Vref1 rises with a rise in the power supply voltage Vcc until the first reference voltage Vref1 reaches the target level, but a slope when the first reference voltage Vref1 rises varies with characteristics of an element constituting the reference voltage generation circuit 204. Thus, the first voltage V1 may exceed the first reference voltage Vref1 even in a transition period in which the first reference voltage Vref1 is rising toward the target level. In an embodiment of the present disclosure, the reference voltage generation circuit 204 generates such a first reference voltage Vref1 as to cause a time period in which the first voltage V1 exceeds the first reference voltage Vref1 in the transition period in which the first reference voltage Vref1 is rising toward the target level.

When the power supply voltage Vcc is applied, the second voltage V2 rises with a rise in the power supply voltage Vcc, and the NMOS transistor 210 is turned on when the second voltage V2 exceeds a gate-source threshold voltage (second reference voltage Vref2) of the NMOS transistor 210. Herein, resistance values of the second voltage divider resistors 207 and 208 and the gate-source threshold voltage of the NMOS transistor 210 are previously set such that the second voltage V2 does not exceed the gate-source threshold voltage of the NMOS transistor 210 until the power supply voltage Vcc reaches a third level L3. The third level L3 is higher than a first level L1, which is a level at a time when the first reference voltage Vref1 exceeds the first voltage V1 and the third level L3 is lower than a second level L2, which is a level at a time when the first voltage V1 reaches the target level of the first reference voltage Vref1. The gate-source threshold voltage of the NMOS transistor 210 can be adjusted by, for example, changing a channel length and/or a voltage applied between a gate electrode and a back gate electrode.

Note that an NPN transistor (bipolar transistor: not illustrated) may be provided instead of the NMOS transistor 210 (MOS transistor), and a base-emitter voltage of the NPN transistor may be used as the second reference voltage Vref2. In this case, resistance values of the second voltage divider resistors 207 and 208 may be set such that the second voltage V2 does not exceed the base-emitter voltage of the NPN transistor until the power supply voltage Vcc reaches the above-described third level L3.

A drain output of the NMOS transistor 210 is input to one of input terminals of the AND gate 211 via the inverter 212. In other words, a detection signal Vdet2 indicative of on and off state of the NMOS transistor 210 output from the inverter 212 is input to one of the input terminals of the AND gate 211. Note that the detection signal Vdet2 at the logic level "L" serves as an inhibiting signal for inhibiting the detection signal Vdet1 at the logic level "H" (reset release signal) from being output to the digital circuit 140. On the other hand, the detection signal Vdet1 output from the first comparator 205 is input to the other input terminal of the AND gate 211. In other words, the AND gate 211 passes and blocks the detection signal Vdet1 output from the first comparator 205 in accordance with on and off of the NMOS transistor 210, respectively. For example, when the NMOS transistor 210 is turned off, the inverter 212 outputs the detection signal Vdet2 at the logic level "L", and thus the AND gate 211 outputs a reset signal RESET at the logic level "L" regardless of a logic level of the detection signal Vdet1 output from the first comparator 205. The reset signal RESET at the logic level "L" is a signal for resetting the digital circuit 140. On the other hand, when the NMOS transistor 210 is turned on, the inverter 212 outputs the detection signal Vdet2 at the logic level "H", and thus the AND gate 211 passes the detection signal Vdet1 at the logic level "H" output from the first comparator 205. The reset signal RESET at the logic level "H" is a signal for releasing reset of the digital circuit 140.

The switch circuit 213 is connected in parallel to the first voltage divider resistor 203. The switch circuit 213 is turned on and off in accordance with a logic level of the reset signal RESET output from the AND gate 211. For example, when the reset signal RESET at the logic level "L" is output from the AND gate 211, the switch circuit 213 is turned on, and short-circuits the first voltage divider resistor 203. On the other hand, when the reset signal RESET at the logic level "H" is output from the AND gate 211, the switch circuit 213 is turned off, and releases a short circuit of the first voltage divider resistor 203. In other words, when a logic level of the reset signal RESET changes from "L" to "H" in order to release reset of the digital circuit 140, the first voltage V1 rises from a divided voltage value without consideration given to a resistance value of the first voltage divider resistor 203, to a divided voltage value with consideration given to the resistance value of the first voltage divider resistor 203. Accordingly, the switch circuit 213 functions as a setting circuit that sets the first voltage V1, which is to be compared with the first reference voltage Vref1 in the first comparator 205, up to a high voltage value with consideration given to the first voltage divider resistor 203, upon releasing of the reset of the digital circuit 140. The switch circuit 213 prevents a malfunction in which the first voltage V1 is affected by chattering and exceeds the first reference voltage Vref1 again after releasing the reset of the digital circuit 140, and another malfunction in which the detection signal Vdet1 of the first comparator 205 repeats transitions between the logic levels of "H" and "L" due to microvibration of the first reference voltage Vref1 when the first voltage V1 is at a level near the first reference voltage Vref1.

Next, an operation of the reset circuit 200A will be described. It is assumed that, in an initial state when the power supply voltage Vcc is applied, the reset signal RESET at the logic level "L" is output from the AND gate 211 in response to OFF of the NMOS transistor 210, and the first voltage divider resistor 203 is short-circuited in response to ON of the switch circuit 213.

When the power supply voltage Vcc is applied, the first voltage V1 and the first reference voltage Vref1 start rising with a rise in the power supply voltage Vcc. As described above, the first reference voltage Vref1 has such a value that the first voltage V1 is higher than the first reference voltage Vref1 until a time T1 due to the characteristics of the element constituting the reference voltage generation circuit 204. In other words, the detection signal Vdet1 at the logic level "H" is output from the first comparator 205 until the time T1. On the other hand, when the power supply voltage Vcc is applied, the second voltage V2 also starts rising with the rise in the power supply voltage Vcc. Herein, the NMOS transistor 210 remains off until the power supply voltage Vcc reaches the third level L3 (time T2) that is higher than the first level L1 (time T1) at a time when the first reference voltage Vref1 exceeds the first voltage V1 and is lower than the second level L2 (time T3) at a time when the first voltage V1 reaches the target level of the first reference voltage Vref1. Accordingly, the detection signal Vdet2 at the logic level "L" is output from the inverter 212, and thus the detection signal Vdet1 at the logic level "H" output from the first comparator 205 is not allowed to pass through the AND gate 211, and the reset signal RESET at the logic level "L" is output from the AND gate 211. In this way, the digital circuit 140 remains in a reset state.

Since the first voltage V1 is lower than the first reference voltage Vref1 in a time period from the time T1 to the time T3, the detection signal Vdet1 at the logic level "L" is output from the first comparator 205. Accordingly, the reset signal RESET at the logic level "L" is output from the AND gate 211. Thus, the digital circuit 140 still remains in the reset state.

At the time T2 between the time T1 and the time T3, the NMOS transistor 210 is turned on, and the detection signal Vdet2 at the logic level "H" is output from the inverter 212. Accordingly, from the time T2, the reset signal RESET at the same logic level as the logic level output from the first comparator 205 is output from the AND gate 211.

At the time T3, the detection signal Vdet1 at the logic level "H" is output from the first comparator 205. Since the detection signal Vdet2 at the logic level "H" has been already output from the inverter 212, the detection signal Vdet1 at the logic level "H" is output as the reset signal RESET from the AND gate 211. This releases the reset of the digital circuit 140. At this time, the short circuit in the first voltage divider resistor 203 is released by turning the switch circuit 213 off, and the first voltage V1 rises by an amount (dot-and-dash line) corresponding to the first voltage divider resistor 203. Accordingly, even when the first voltage V1 fluctuates due to chattering or the first reference voltage Vref1 minutely vibrates, the first comparator 205 normally operates.

Second Embodiment

Figure 4:
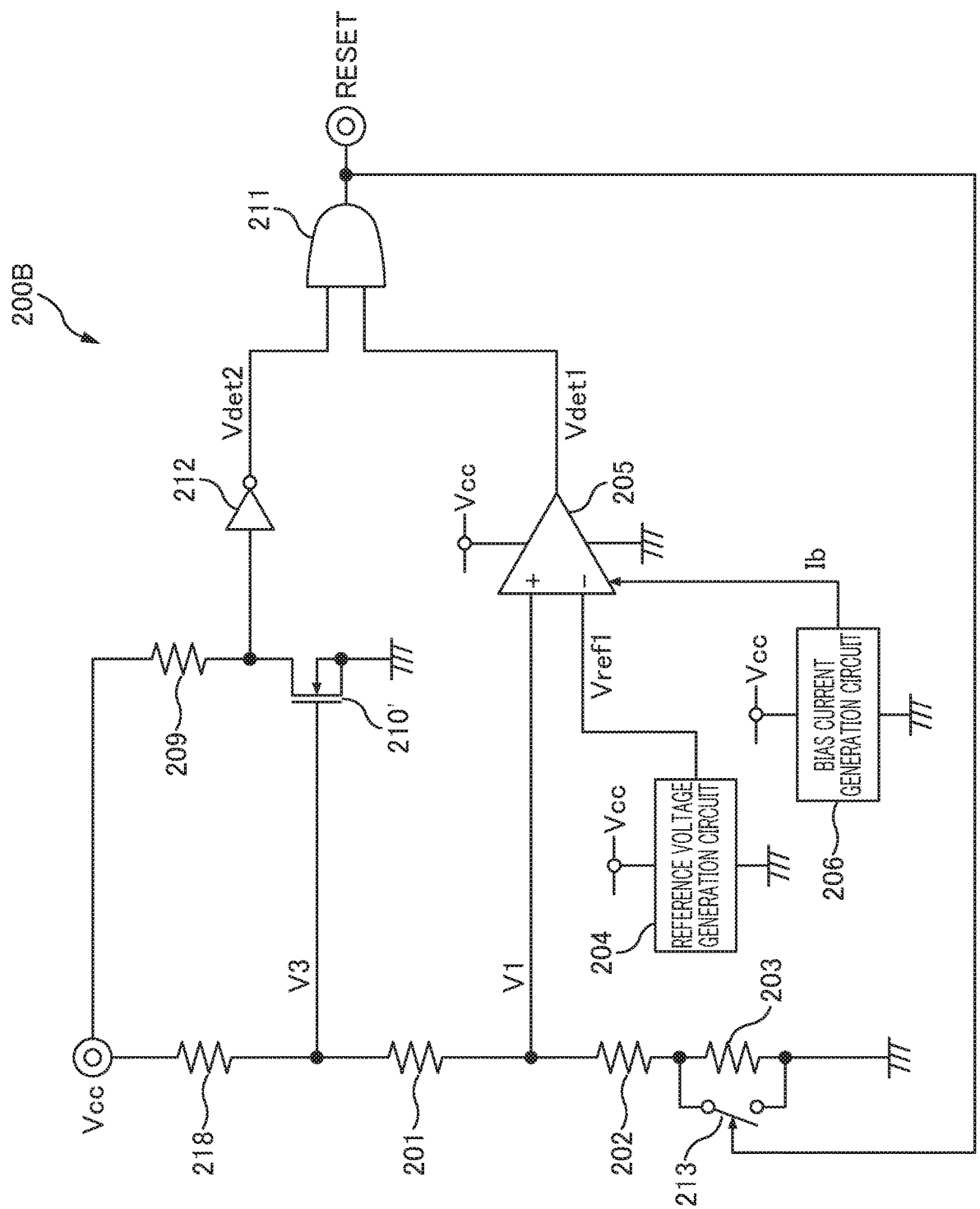
FIG. 4 is a circuit block diagram illustrating a reset circuit according to a second embodiment.

FIG. 4 is a circuit block diagram illustrating a reset circuit according to a second embodiment. Note that elements of the reset circuit 200B that are the same as those of the reset circuit 200A are given the same reference numerals, and description of configurations and operations thereof is omitted.

The reset circuit 200B is configured such that the first voltage divider resistors 201 to 203 in the reset circuit 200A are replaced with first voltage divider resistors 201 to 203 and 218, the second voltage divider resistors 207 and 208 in the reset circuit 200A are eliminated, the NMOS transistor 210 in the reset circuit 200A is replaced with an NMOS transistor 210', and a third voltage V3 (>a first voltage V1) that appears at a connection point of the first voltage divider resistors 218 and 201 is applied to a gate of the NMOS transistor 210'.

Then, resistance values of the first voltage divider resistors 201 to 203 and 218 and a gate-source threshold voltage of the NMOS transistor 210' are previously set such that the third voltage V3 does not exceed the gate-source threshold voltage of the NMOS transistor 210' until a power supply voltage Vcc reaches a third level L3 that is higher than a first level L1 at a time when a first reference voltage Vref1 exceeds the first voltage V1 and is lower than a second level L2 at a time when the first voltage V1 reaches a target level of the first reference voltage Vref1. The gate-source threshold voltage of the NMOS transistor 210' can be adjusted by, for example, changing a channel length and/or a voltage applied between a gate electrode and a back gate electrode.

Third Embodiment

Figure 5:
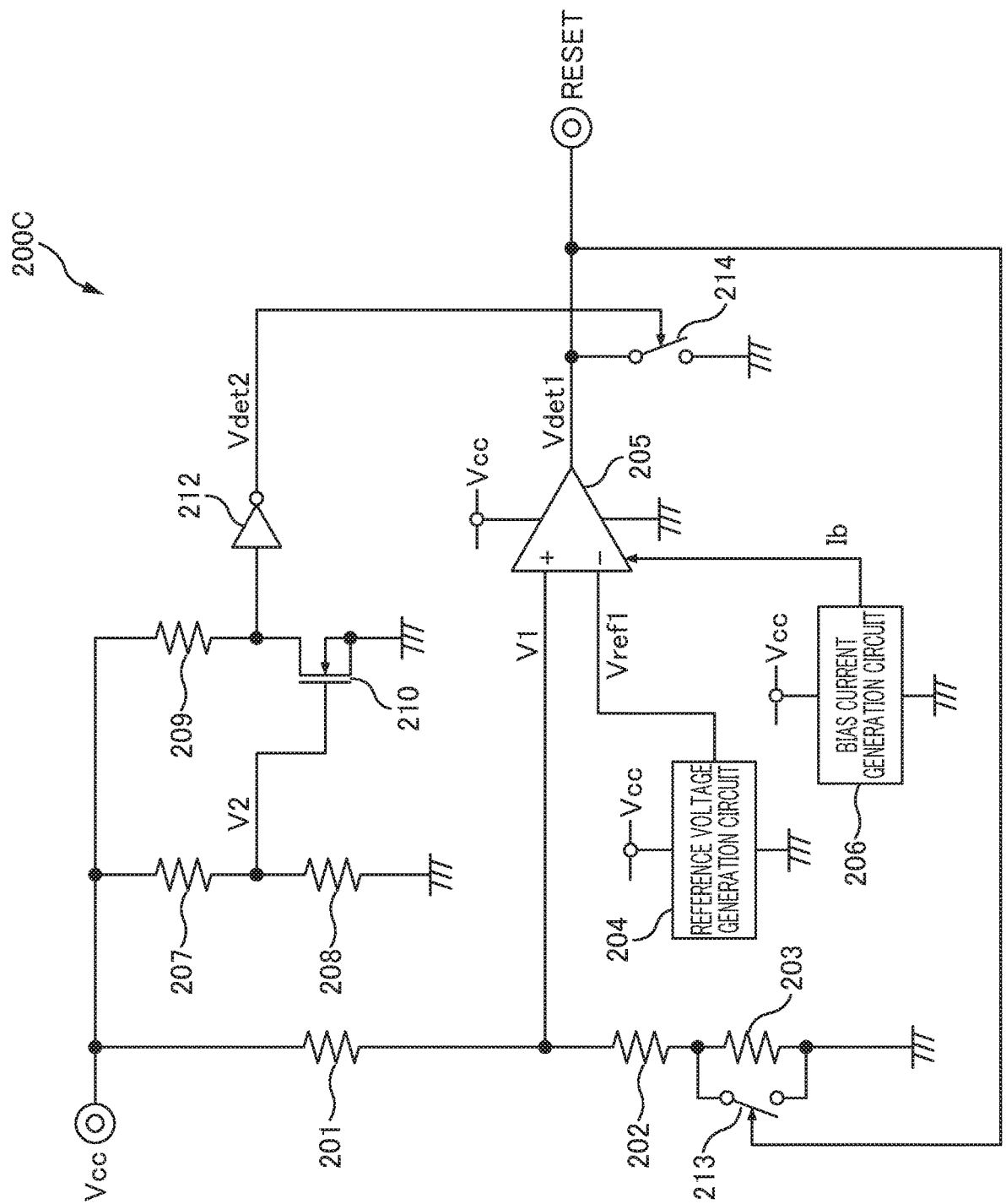
FIG. 5 is a circuit block diagram illustrating a reset circuit according to a third embodiment.

FIG. 5 is a circuit block diagram illustrating a reset circuit according to a third embodiment. Note that elements of the reset circuit 200C that are the same as those of the reset circuit 200A are given the same reference numerals, and description of configurations and operations thereof is omitted.

The reset circuit 200C includes a switch circuit 214 instead of the AND gate 211 in the reset circuit 200A.

The switch circuit 214 is connected between an output terminal of a first comparator 205 and the ground, and is turned on and off in response to a detection signal Vdet2 output from an inverter 212. For example, when a second voltage V2 does not reach a gate-source threshold voltage of an NMOS transistor 210, the switch circuit 214 is turned on by the detection signal Vdet2 at a logic level "L". Accordingly, a reset signal RESET fixed at the logic level "L" is output regardless of a logic level of a detection signal Vdet1 output from the first comparator 205. This causes a digital circuit 140 to remain in a reset state. On the other hand, when the second voltage V2 reaches the gate-source threshold voltage of an NMOS transistor 210, the switch circuit 214 is turned off by the detection signal Vdet2 at a logic level "H". Accordingly, the detection signal Vdet1 at the logic level output from the first comparator 205 is output as the reset signal RESET as it is. In this way, when the detection signal Vdet1 at the logic level "H" is output from the first comparator 205, the reset of the digital circuit 140 is released.

When a logic level of the detection signal Vdet1 output from the first comparator 205 is "L", the switch circuit 213 is turned on and short-circuits a first voltage divider resistor 203. When the logic level of the detection signal Vdet1 output from the first comparator 205 is "H", the switch circuit 213 is turned off and releases the short circuit of the first voltage divider resistor 203.

Fourth Embodiment

Figure 6:
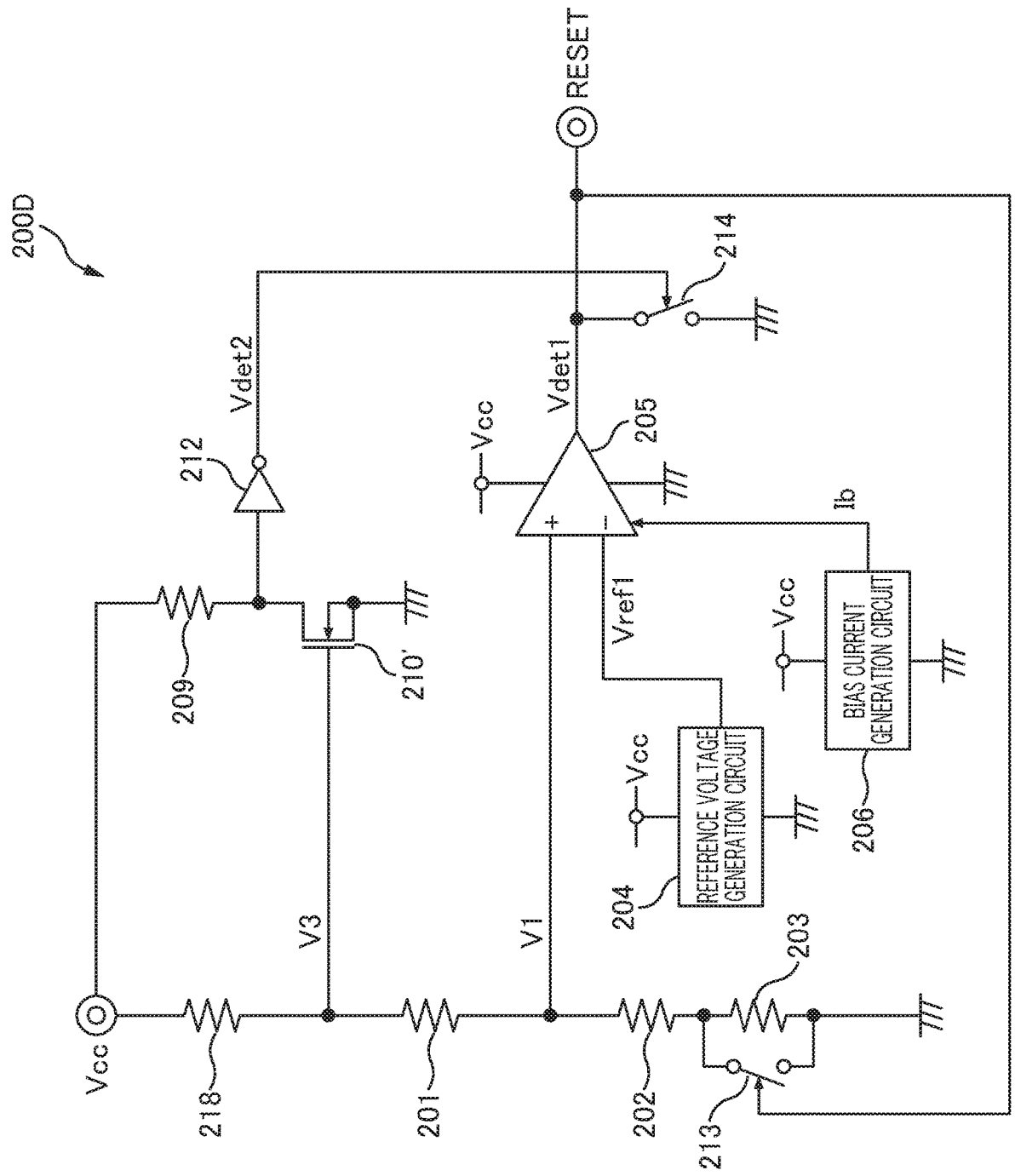
FIG. 6 is a circuit block diagram illustrating a reset circuit according to a fourth embodiment.

FIG. 6 is a circuit block diagram illustrating a reset circuit according to a fourth embodiment. Note that elements of the reset circuit 200D that are the same as those of the reset circuit 200A are given the same reference numerals, and description of configurations and operations thereof is omitted.

The reset circuit 200D is configured such that the first voltage divider resistors 201 to 203 in the reset circuit 200A are replaced with first voltage divider resistors 201 to 203 and 218, the second voltage divider resistors 207 and 208 in the reset circuit 200A are eliminated, the NMOS transistor 210 in the reset circuit 200A is replaced with an NMOS transistor 210', and a third voltage V3 (>a first voltage V1) that appears at a connection point of the first voltage divider resistors 218 and 201 is applied to a gate of the NMOS transistor 210'.

Furthermore, the reset circuit 200D includes a switch circuit 214 instead of the AND gate 211 in the reset circuit 200A. Note that the NMOS transistor 210' has been described in the second embodiment, and the switch circuit 214 has been described in the third embodiment, and thus the description thereof is omitted.

Fifth Embodiment

Figure 7:
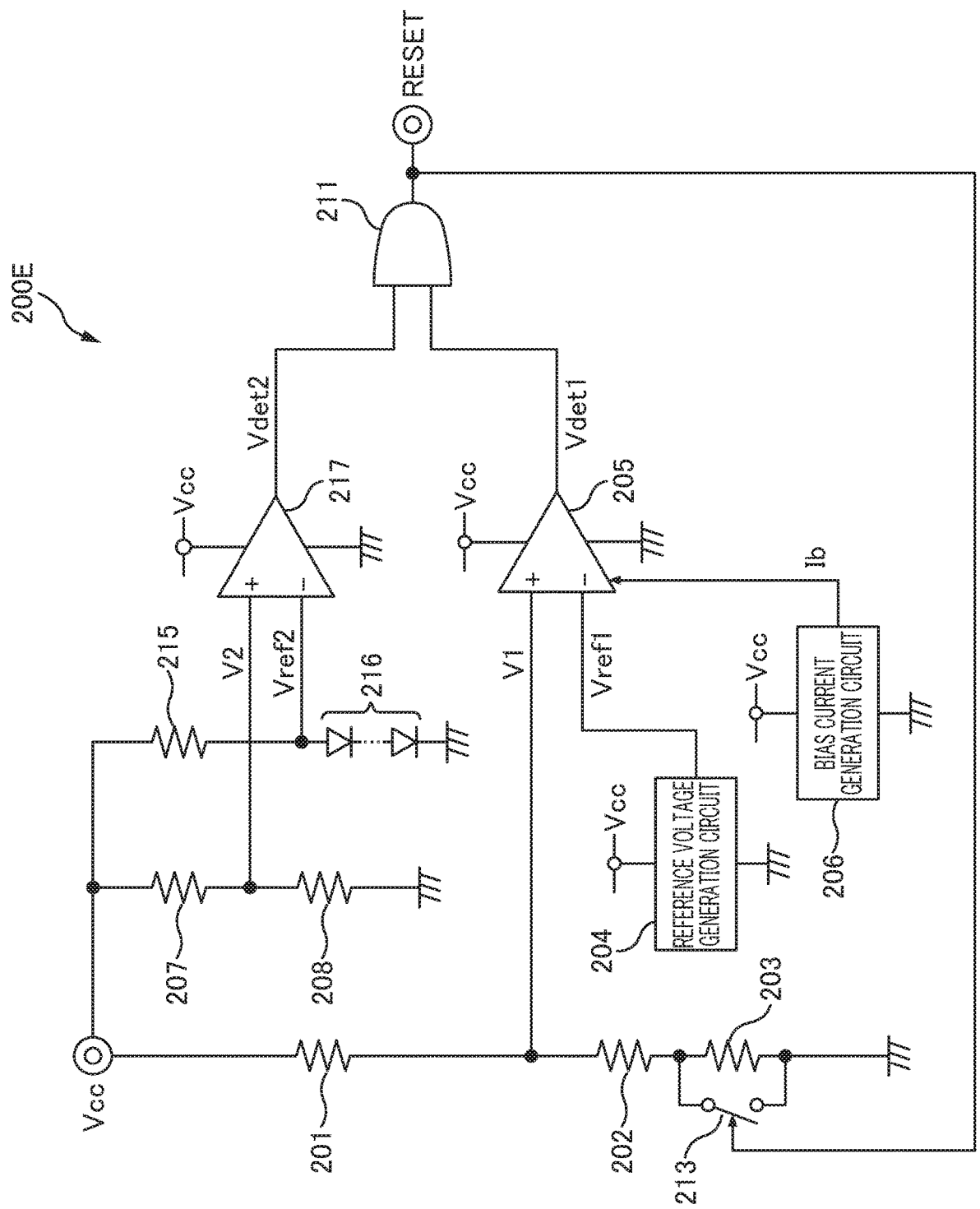
FIG. 7 is a circuit block diagram illustrating a reset circuit according to a fifth embodiment.

FIG. 7 is a circuit block diagram illustrating a reset circuit according to a fifth embodiment. Note that elements of the reset circuit 200E that are the same as those of the reset circuit 200A are given the same reference numerals, and description of configurations and operations thereof is omitted.

The reset circuit 200E includes a resistor 215, a diode 216 including one or more stages, and a second comparator 217 instead of the pull-up resistor 209, the NMOS transistor 210, the AND gate 211, and the inverter 212 in the reset circuit 200A.

The resistor 215 and the diode 216 are connected in series between a power supply voltage Vcc and the ground. A second voltage V2 that appears at a connection point of the second voltage divider resistors 207 and 208 is applied to a non-inverting input terminal of the second comparator 217. A voltage that appears at a connection point of the resistor 215 and the diode 216 (a forward voltage that appears across the diode 216) is applied as a second reference voltage Vref2 to an inverting input terminal of the second comparator 217. Then, the second comparator 217 outputs a detection signal Vdet2 at a logic level "L" when the second voltage V2 is lower than the second reference voltage Vref2, and outputs a detection signal Vdet2 at a logic level "H" when the second voltage V2 is higher than the second reference voltage Vref2.

When the power supply voltage Vcc is applied, the second voltage V2 rises with a rise in the power supply voltage Vcc, and the second comparator 217 outputs the detection signal Vdet2 at the logic level "H" when the second voltage V2 exceeds the forward voltage that appears across the diode 216. Herein, resistance values of the second voltage divider resistors 207 and 208 and the number of stages of the diode 216 are previously set such that the second voltage V2 does not exceed the forward voltage that appears across the diode 216 until the power supply voltage Vcc reaches a third level L3 that is higher than a first level L1 at a time when a first reference voltage Vref1 exceeds a first voltage V1 and is lower than a second level L2 at a time when the first voltage V1 reaches a target level of the first reference voltage Vref1.

Note that a Zener diode (not illustrated) including one or more stages may be provided instead of the diode 216, and a voltage across the Zener diode may be used as the second reference voltage Vref2. In this case, resistance values of the second voltage divider resistors 207 and 208 may be set such that the second voltage V2 does not exceed the voltage across the Zener diode until the power supply voltage Vcc reaches the above-described third level L3.

The detection signal Vdet2 output from the second comparator 217 is input to one of input terminals of an AND gate 211, and a detection signal Vdet1 output from a first comparator 205 is input to the other input terminal of the AND gate 211. In other words, the AND gate 211 passes and blocks the detection signal Vdet1 output from the first comparator 205 in accordance with a logic level of the detection signal Vdet2 output from the second comparator 217. For example, when the detection signal Vdet2 at the logic level "L" is output from the second comparator 217, the AND gate 211 outputs a reset signal RESET at the logic level "L" regardless of a logic level of the detection signal Vdet1 output from the first comparator 205. On the other hand, when the detection signal Vdet2 at the logic level "H"

is output from the second comparator 217, the AND gate 211 outputs, as the reset signal RESET, the detection signal Vdet1 at the logic level "H" output from the first comparator 205. In this way, when the reset signal RESET at the logic level "H" is output from the AND gate 211, the reset of the digital circuit 140 is released.

Sixth Embodiment

Figure 8:
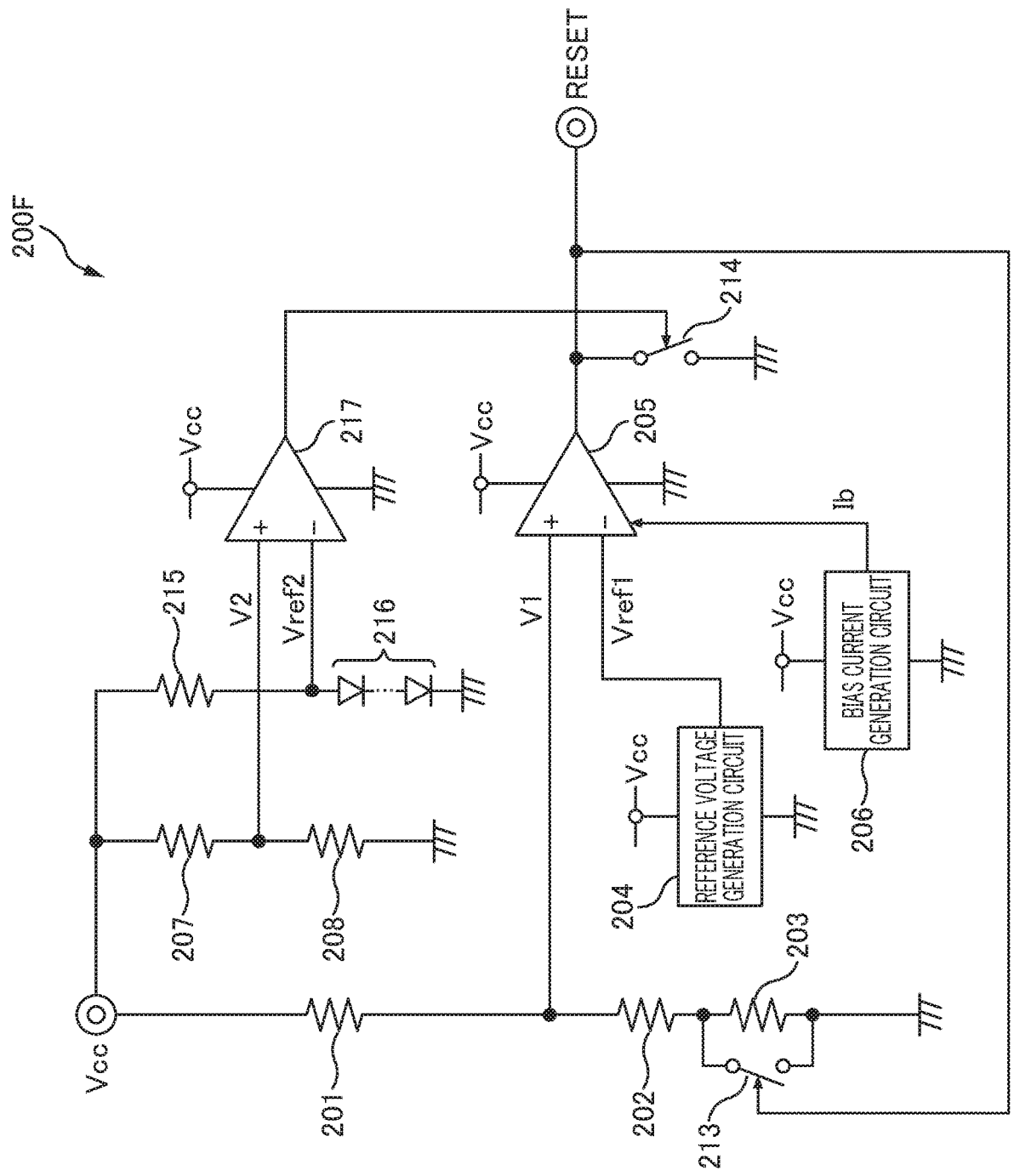
FIG. 8 is a circuit block diagram illustrating a reset circuit according to a sixth embodiment.

FIG. 8 is a circuit block diagram illustrating a reset circuit according to a sixth embodiment. Note that elements of the reset circuit 200F that are the same as those of the reset circuit 200E are given the same reference numerals, and description of configurations and operations thereof is omitted.

The reset circuit 200F includes a switch circuit 214 instead of the AND gate 211 in the reset circuit 200E.

The switch circuit 214 is connected between an output terminal of a first comparator 205 and the ground, and is turned on and off in accordance with a logic level of a detection signal Vdet2 output from a second comparator 217. For example, when a second voltage V2 does not reach a voltage across a diode 216, the switch circuit 214 is turned on by the detection signal Vdet2 at a logic level "L" output from the second comparator 217. Accordingly, a reset signal RESET fixed at the logic level "L" is output regardless of a logic level of a detection signal Vdet1 output from the first comparator 205. This causes a digital circuit 140 to remain in a reset state. On the other hand, when the second voltage V2 reaches the voltage across the diode 216, the switch circuit 214 is turned off by the detection signal Vdet2 at a logic level "H" output from the second comparator 217. Accordingly, the detection signal Vdet1 at the logic level output from the first comparator 205 is output as the reset signal RESET as it is. In this way, when the detection signal Vdet1 at the logic level "H" is output from the first comparator 205, the reset of the digital circuit 140 is released.

Summary

As has been described above, the reset circuits 200A to 200F according to embodiments of the present disclosure include: an output circuit outputs the detection signal Vdet1 at the logic level "H" for releasing reset of the digital circuit 140 to be applied with the power supply voltage Vcc, when the first voltage V1 that rises with a rise in the power supply voltage Vcc reaches the first reference voltage Vref1 that rises with a rise in the power supply voltage Vcc until the first reference voltage Vref1 reaches the target level; and an inhibit circuit that inhibits the detection signal Vdet1 at the logic level "H" from being output to the digital circuit 140 until the power supply voltage Vcc reaches the third level L3 that is higher than the first level L1 at a time when the first reference voltage Vref1 exceeds the first voltage V1 and that is lower than the second level L2 at a time when the first voltage V1 reaches the target level. Then, it is possible to reliably inhibit releasing of the reset of the digital circuit 140 until the power supply voltage Vcc reaches a stable voltage at which the digital circuit 140 can normally operate, even when a time period in which the first voltage V1 is higher than the first reference voltage Vref1 occurs. This can prevent a digital signal OUT from being erroneously output due to unintentional reset operation, and prevent a signal indicative of unintentional reset operation from being output to the outside.

Further, the output circuit includes the first comparator 205 that compares the first voltage V1 produced from the first voltage divider resistors 201 to 203 with the first reference voltage Vref1 generated from the reference voltage generation circuit 204, and outputs the detection signal Vdet1 at the logic level "H" serving as a reset release signal for the digital circuit 140, the first voltage divider resistors 201 to 203 and the reference voltage generation circuit 204 being configured to be applied with the power supply voltage Vcc. Accordingly, both of the first voltage V1 and the first reference voltage Vref1 rise with a rise in the power supply voltage Vcc, and thus the output circuit can output the detection signal Vdet1 at the logic level "H" when the first voltage V1 exceeds the first reference voltage Vref1.

Further, the inhibit circuit includes the NMOS transistor 210 that operates to inhibit the detection signal Vdet1 at the logic level "H" from being output as a reset release signal to the digital circuit 140 until the second voltage V2 produced from the second voltage divider resistors 207 and 208 to be applied with the power supply voltage Vcc reaches a threshold voltage set as the second reference voltage Vref2. At this time, each value of the second voltage divider resistors 207 and 208 and a threshold voltage of the NMOS transistor 210 is previously set to a value for inhibiting the detection signal Vdet1 at the logic level "H" from being output to the digital circuit 140 until the power supply voltage Vcc reaches the third level L3. This enables the inhibit circuit to have a simple configuration in which the threshold voltage of the NMOS transistor 210 is set to the above-described value. Note that an NPN transistor may be provided instead of the NMOS transistor 210.

Further, the inhibit circuit may include the NMOS transistor 210' that operates to inhibit the detection signal Vdet1 at the logic level "H" from being output as a reset release signal to the digital circuit 140 until the third voltage V3 produced from the connection point of the first voltage divider resistors 201 and 218 to be applied with the power supply voltage Vcc reaches a threshold voltage set as the second reference voltage Vref2. At this time, each value of the resistance values of the first voltage divider resistors 201 to 203 and 218 and a threshold voltage of the NMOS transistor 210' is previously set to a value for inhibiting the detection signal Vdet1 at the logic level "H" from being output to the digital circuit 140 until the power supply voltage Vcc reaches the third level L3. This enables the inhibit circuit to have a simple configuration in which each value of the resistance values of the first voltage divider resistors 201 to 203 and 218 used for the first comparator 205 and the threshold voltage of the NMOS transistor 210' is set to a value described above, in addition to enabling elimination of the second voltage divider resistors 207 and 208. Note that an NPN transistor may be provided instead of the NMOS transistor 210'.

Further, the inhibit circuit includes the AND gate 211 that inhibits the detection signal Vdet1 at the logic level "H" from being output to the digital circuit 140, based on the detection signal Vdet2 at the logic level "L". Accordingly, the AND gate 211 passes and blocks the detection signal Vdet1 in accordance with a logic level of the detection signal Vdet2, and thus can output the reset signal RESET at a definite logic level to the digital circuit 140.

Further, the inhibit circuit may include the switch circuit 214 that fixes, at "L", a logic level of the detection signal Vdet1 output from the first comparator 205, based on the detection signal Vdet2 at the logic level "L". This makes it possible to output the reset signal RESET at a definite logic level to the digital circuit 140.

Further, the inhibit circuit includes the second comparator 217 that compares the second voltage V2 produced from the second voltage divider resistors 207 and 208 to be applied with the power supply voltage Vcc, with the voltage across the diode 216 set as the second reference voltage Vref2, and inhibits the detection signal Vdet1 at the logic level "H" from being output to the digital circuit 140. At this time, each value of the resistance values of the second voltage divider resistors 207 and 208 and the voltage across the diode 216 is previously set to a value for inhibiting the detection signal Vdet1 at the logic level "H" from being output to the digital circuit 140 until the power supply voltage Vcc reaches the third level L3. This enables the inhibit circuit to have a simple configuration in which the voltage across the diode 216 is set to a value described above. Note that a Zener diode may be provided instead of the diode 216.

Further, the inhibit circuit includes the AND gate 211 that inhibits the detection signal Vdet1 at the logic level "H" from being output to the digital circuit 140, based on the detection signal Vdet2 at the logic level "L" output from the second comparator 217. Accordingly, the AND gate 211 passes and blocks the detection signal Vdet1 in accordance with a logic level of the detection signal Vdet2. This makes it possible to output the reset signal RESET at a definite logic level to the digital circuit 140.

Further, the inhibit circuit may include the switch circuit 214 that fixes, at "L", a logic level of the detection signal Vdet1 output from the first comparator 205, based on the detection signal Vdet2 output from the second comparator 217. This makes it possible to output the reset signal RESET at a definite logic level to the digital circuit 140.

Further, the output circuit includes the switch circuit 213 that sets the first voltage V1 to be higher by an amount corresponding to a resistance value of the first voltage divider resistor 203, based on the reset signal RESET at the logic level "H" (=the detection signal Vdet1 at the logic level "H") output to the digital circuit 140. Accordingly, even when the first voltage V1 fluctuates by chattering after releasing the reset of the digital circuit 140, a malfunction of the first comparator 205 can be prevented.

Further, when the digital circuit 140, for example, digitally processes a detection output of the pressure sensor 110, it is possible to reliably perform the digital processing needed for a pressure detection value of the pressure sensor 110.

The above embodiments of the present disclosure are simply for facilitating the understanding of the present disclosure and are not in anyway to be construed as limiting the present disclosure. The present disclosure may variously be changed or altered without departing from its spirit and encompass equivalents thereof.

What is claimed is:

1. A reset circuit for generating a reset release signal for releasing reset of a reset target circuit from a power supply voltage, the reset circuit comprising:
an output circuit that outputs the reset release signal, obtained from a first voltage and a first reference voltage, in response to the first voltage exceeding the first reference voltage, the first voltage rising with a rise in the power supply voltage, the first reference voltage rising with a rise in the power supply voltage until the first reference voltage reaches a target level; and
an inhibit circuit that inhibits the reset release signal from being output to the reset target circuit until the power supply voltage reaches a third level, the third level being higher than a first level and lower than a second level, the first level being a voltage level of the power supply voltage at a first time when the first reference voltage reaches the first voltage, the second level being a voltage level of the power supply voltage at a second time when the first voltage reaches the target level,
wherein the inhibit circuit includes
a first voltage divider having a plurality of resistors, the first voltage divider dividing the power supply voltage to generate a second voltage, and
a transistor to which the second voltage is applied to be turned on or off, whereby an inhibit signal is generated, and
wherein a resistor value of each of the resistors of the first voltage divider and a threshold voltage of the second voltage for turning the on or off of the transistor are set such that the inhibit circuit inhibits the reset release signal from being output by the inhibit signal until the power supply voltage reaches the third level.

2. The reset circuit according to claim 1, wherein
the output circuit comprises a second voltage divider generating the first voltage by dividing the power supply voltage, and a first comparator that compares the first voltage with the first reference voltage generated from a reference voltage generation circuit to which the power supply voltage is applied.

3. The reset circuit according to claim 2, wherein
the resistor value of the resistors of the first voltage divider and the threshold voltage are set such that the on or off of the transistor is switched only after the first time so that the inhibit circuit inhibits the reset release signal from being output to the reset target circuit until the power supply voltage reaches the third level.

4. The reset circuit according to claim 2, wherein
second voltage divider includes resistors, and at least one of the resistors in each of the first and second voltage dividers are common.

5. The reset circuit according to claim 1, wherein
the inhibit circuit comprises an AND circuit that inhibits the reset release signal from being output to the reset target circuit, based on an inhibiting signal for inhibiting the reset release signal from the transistor from being output to the reset target circuit.

6. The reset circuit according to claim 1, wherein
the output circuit include a first comparator that compares the first voltage with the first reference voltage, and
the inhibit circuit comprises a switch circuit that fixes an output of the first comparator at a logic level different from a logic level of the reset release signal until the first time, using the inhibiting signal generated by the transistor.

7. A reset circuit for generating a reset release signal for releasing reset of a reset target circuit from a power supply voltage, the reset circuit comprising:
an output circuit that outputs the reset release signal, obtained from a first voltage and a first reference voltage, in response to the first voltage exceeding the first reference voltage, the first voltage rising with a rise in the power supply voltage, the first reference voltage rising with a rise in the power supply voltage until the first reference voltage reaches a target level; and
an inhibit circuit that inhibits the reset release signal from being output to the reset target circuit until the power supply voltage reaches a third level, the third level being higher than a first level and lower than a second level, the first level being a voltage level of the power supply voltage at a first time when the first reference voltage reaches the first voltage, the second level being a voltage level of the power supply voltage at a second time when the first voltage reaches the target level, wherein the output circuit includes a first comparator that compares the first voltage generated by a first voltage divider with the first reference voltage generated from a reference voltage generation circuit to which the power supply voltage is applied, the first voltage divider including resistors, and dividing the power supply voltage to generate the first voltage, and the inhibit circuit comprises a second comparator that compares the second voltage generated by the first voltage divider, with a voltage across a diode set as a second reference voltage, and a resistor value of each of the resistors of the first voltage divider and the voltage across the diode are set such that the inhibit circuit inhibits the reset release signal from being output to the reset target circuit until the power supply voltage reaches the third level.

8. The reset circuit according to claim 7, wherein
the inhibit circuit comprises an AND circuit that inhibits the reset release signal from being output to the reset target circuit, based on an inhibiting signal for inhibiting the reset release signal from the second comparator from being output to the reset target circuit.

9. The reset circuit according to claim 7, wherein
the inhibit circuit comprises a switch circuit that fixes an output of the first comparator at a logic level different from a logic level of the reset release signal, using an inhibiting signal for inhibiting the reset release signal from the second comparator from being output to the reset target circuit.

10. The reset circuit according to claim 1, wherein
the output circuit comprises a setting circuit that sets the first voltage to be higher by a predetermined level, based on the reset release signal output to the reset target circuit.

11. The reset circuit according to claim 1, wherein
the reset target circuit is a digital circuit that digitally processes a detection output of a pressure sensor.

12. The reset circuit according to claim 4, wherein
the inhibit circuit comprises an AND circuit that inhibits the reset release signal from being output to the reset target circuit, based on an inhibiting signal for inhibiting the reset release signal from the from being output to the reset target circuit.

13. The reset circuit according to claim 4, wherein
the inhibit circuit comprises a switch circuit that fixes an output of the first comparator at a logic level different from a logic level of the reset release signal, based on an inhibiting signal for inhibiting the reset release signal from the transistor from being output to the reset target circuit.

14. A reset circuit for generating a reset release signal for releasing reset of a reset target circuit from a power supply voltage, the power supply voltage having a variable level that increases after powered on for a predetermined period including first and second times, the reset circuit comprising:

an output circuit that generates a detection signal by comparing a first voltage with a first reference voltage, the detection signal having a first level before the first time and after the second time, and a second level between the first time and the second time, the first voltage and the reference voltage being generated from the power supply voltage, the first reference voltage rising until the first reference voltage reaches a target level;

an inhibit circuit that generates an inhibit signal to inhibit the detection signal from being outputted as the reset release signal after powered on until at least the first time, wherein the inhibit circuit includes
a divider having resistors, the divider dividing the power supply voltage to generate a second voltage, and a transistor that is turned on or off by the second voltage, thereby generating the inhibit signal, and a resistor value of each of the resistors and a threshold voltage of the second voltage for the transistor are set such that the reset release signal is inhibited to be outputted before the first time, the first time is a time when the first reference voltage exceeds the first voltage after powered on, and the second time is a time when the first voltage exceeds the target voltage after the first time.

15. The reset circuit according to claim 14, wherein
the resistor value of each of the resistors and the threshold voltage of the second voltage for the transistor are set such that the on or off of the transistor is switched at least after the first time so that the reset release signal is inhibited to be output before the first time.

* * * * *